United States Patent [19]
Lai et al.

[11] Patent Number: 5,981,018
[45] Date of Patent: Nov. 9, 1999

[54] MAGNETIC RECORDING MEDIA USED IN A HIGH-DENSITY HARD DISK DRIVE

[75] Inventors: Tai-Hwang Lai, Hsin-chu; Yu-Yun Lo, Hsien; Chiun-Yen Tung, Chun-ho, all of Taiwan; James Liang, Piscataway, N.J.; Hung-Huei Liang, Hsien, Taiwan

[73] Assignee: Trace Storage Technology Corp., Hsin-Chu, Taiwan

[21] Appl. No.: 09/078,311

[22] Filed: May 13, 1998

[51] Int. Cl.[6] .................................................. B32B 3/02
[52] U.S. Cl. .................... 428/65.5; 204/192.1; 427/131; 427/132; 428/65.6; 428/65.7; 428/336; 428/611; 428/635; 428/662; 428/667; 428/678; 428/680; 428/694 TS; 428/694 TC; 428/900; 428/928
[58] Field of Search ................................ 428/65.5, 65.6, 428/65.7, 336, 611, 635, 662, 667, 678, 680, 694 TS, 694 TC, 900, 928; 204/192.2; 427/131, 132

Primary Examiner—Bernard Pianalto

[57] ABSTRACT

The present invention relates to high-coercivity magnetic recording media used in a hard disk drive. The magnetic recording medium comprises a nonmagnetic substrate, a seed layer comprising NiAl alloy sputtered onto the substrate, a sublayer comprising CrV alloy sputtered onto the seed layer, a magnetic layer comprising CoCrPtTaNb alloy sputtered onto the sublayer, and a carbon overcoat sputtered onto the magnetic layer. The magnetic recording medium of such a structure has improved signal-to-noise ratio, coercivity, overwrite capability, and orientation ratio thereby greatly improving the storage density and read/write capacity of the magnetic recording medium. Furthermore, the coercivity of the magnetic layer of CoCrPtTaNb alloy according to the present invention can be as high as 4000 Oersteds even without the use of the NiAl seed layer.

13 Claims, 5 Drawing Sheets

| Track (ID) | | HF | LF | Res. | OW | PW | PMOD | NMOD | NLTS | SQZ | SoNR | SNR | Noise | Sp Noise |
|---|---|---|---|---|---|---|---|---|---|---|---|---|---|---|
| Sample A-1 | AVG. | 0.254 | 0.601 | 42.12 | 43.06 | 21.33 | 10.26 | -8.97 | -18.32 | 46.23 | 37.02 | 29.52 | -27.72 | 32.94 |
| | STDEV. | 0.005 | 0.007 | 0.47 | 0.204 | 0.162 | 1.866 | 2.301 | 0.135 | 0.747 | 0.08 | 0.08 | 0.20 | 0.07 |
| Sample B-1 | AVG. | 0.260 | 0.612 | 42.34 | 41.66 | 21.47 | 9.25 | -8.14 | -18.32 | 47.12 | 36.20 | 28.65 | -26.70 | 32.13 |
| | STDEV. | 0.007 | 0.004 | 1.02 | 0.133 | 0.176 | 1.741 | 1.041 | 0.218 | 0.523 | 0.19 | 0.03 | 0.15 | 0.20 |
| CoCrPtTaNb 76/15/5/2/2 (NiAl 500Å/CrV100Å) | AVG. | 0.269 | 0.622 | 43.12 | 41.22 | 21.65 | 8.70 | -6.06 | -18.25 | 48.03 | 35.75 | 28.44 | -25.93 | 32.24 |
| | STDEV. | 0.002 | 0.007 | 0.14 | 0.083 | 0.114 | 0.736 | 1.050 | 0.131 | 0.432 | 0.11 | 0.08 | 0.25 | 0.13 |
| CoCrPtTaNb 76/15/5/2/2 (No NiAl / CrV300Å) | AVG. | 0.303 | 0.647 | 46.72 | 39.60 | 21.94 | 8.96 | -6.39 | -17.62 | 40.95 | 33.19 | 26.57 | -23.44 | 30.51 |
| | STDEV. | 0.002 | 0.004 | 0.38 | 0.086 | 0.204 | 0.660 | 0.230 | 0.062 | 0.953 | 0.03 | 0.09 | 0.20 | 0.27 |
| CoCrPtTaNb 76/15/5/2/2 (No NiAl / CrV500Å) | AVG. | 0.253 | 0.621 | 40.61 | 42.25 | 21.99 | 8.45 | -6.28 | -17.95 | 45.34 | 36.36 | 28.51 | -25.40 | 31.92 |
| | STDEV. | 0.004 | 0.006 | 0.45 | 0.307 | 0.123 | 0.914 | 0.609 | 0.146 | 0.694 | 0.28 | 0.20 | 0.15 | 0.35 |

Table. 1

| Track (OD) | | HF | LF | Res. | OW | PW | PMOD | NMOD | NLTS | SQZ |
|---|---|---|---|---|---|---|---|---|---|---|
| Sample A-2 | AVG. | 0.289 | 0.494 | 58.44 | 37.63 | 13.08 | 9.95 | -7.85 | -18.83 | 44.49 |
|  | STDEV. | 0.014 | 0.007 | 2.51 | 0.304 | 0.106 | 1.559 | 1.425 | 0.523 | 0.725 |
| Sample B-2 | AVG. | 0.318 | 0.523 | 60.76 | 36.52 | 13.15 | 8.35 | -6.07 | -17.97 | 45.58 |
|  | STDEV. | 0.015 | 0.007 | 2.02 | 0.466 | 0.066 | 1.938 | 0.713 | 0.480 | 0.471 |
| CoCrPtTaNb 76/15/5/2/2 (NiAl 725Å/CrV300Å) | AVG. | 0.316 | 0.522 | 60.55 | 35.39 | 13.11 | 5.46 | -8.01 | -18.08 | 46.18 |
|  | STDEV. | 0.002 | 0.004 | 0.53 | 0.132 | 0.097 | 0.769 | 0.634 | 0.220 | 0.412 |
| CoCrPtTaNb 76/15/5/2/2 (No NiAl / CrV475Å) | AVG. | 0.328 | 0.534 | 61.48 | 36.27 | 13.31 | 7.22 | -8.99 | -17.62 | 37.81 |
|  | STDEV. | 0.006 | 0.003 | 1.20 | 0.070 | 0.069 | 1.740 | 1.330 | 0.149 | 0.181 |
| CoCrPtTaNb 76/15/5/2/2 (No NiAl / CrV500Å) | AVG. | 0.301 | 0.516 | 58.29 | 36.36 | 13.29 | 5.60 | -8.07 | -18.54 | 44.24 |
|  | STDEV. | 0.006 | 0.004 | 1.11 | 0.501 | 0.038 | 1.264 | 1.264 | 0.295 | 0.493 |

Table. 2

| Track (ID) | | HF | LF | Res. | OW | PW | PMOD | NMOD | NLTS | SQZ | SoNR | SNR | Noise | Sp Noise |
|---|---|---|---|---|---|---|---|---|---|---|---|---|---|---|
| Sample A-3 | AVG. | 0.255 | 0.587 | 13.33 | 42.17 | 21.45 | 9.50 | -13.99 | -18.86 | 46.68 | 30.47 | 27.79 | -24.81 | 30.73 |
| | STDEV. | 0.004 | 0.006 | 0.50 | 0.297 | 0.084 | 0.890 | 1.498 | 0.058 | 1.032 | 0.06 | 0.07 | 0.18 | 0.18 |
| CoCrPtTaNb 74/17/5/2/2 (NiAl 500Å/CrV100Å) | AVG. | 0.226 | 0.567 | 39.78 | 43.91 | 22.29 | 13.21 | -15.38 | -19.57 | 47.73 | 31.75 | 28.31 | -26.70 | 32.13 |
| | STDEV. | 0.004 | 0.002 | 0.62 | 0.247 | 0.071 | 1.227 | 1.128 | 0.072 | 0.300 | 0.30 | 0.29 | 0.15 | 0.20 |
| CoCrPtTaNb 74/17/5/2/2 (No NiAl / CrV300Å) | AVG. | 0.278 | 0.598 | 46.43 | 41.44 | 21.13 | 12.15 | -14.82 | -19.20 | 46.57 | 29.93 | 27.82 | -25.93 | 32.24 |
| | STDEV. | 0.003 | 0.003 | 0.53 | 0.320 | 0.042 | 1.275 | 0.440 | 0.063 | 0.723 | 0.31 | 0.21 | 0.25 | 0.13 |
| CoCrPtTaNb 74/17/5/2/2 (No NiAl / CrV500Å) | AVG. | 0.273 | 0.579 | 46.97 | 40.89 | 20.85 | 10.04 | -13.64 | -18.83 | 48.16 | 27.53 | 25.55 | -23.44 | 30.51 |
| | STDEV. | 0.007 | 0.007 | 0.75 | 0.423 | 0.116 | 0.573 | 1.014 | 0.277 | 1.015 | 0.44 | 0.30 | 0.20 | 0.27 |

Table. 3

| Track (OD) | | HF | LF | Res. | OW | PW | PMOD | NMOD | NLTS | SQZ |
|---|---|---|---|---|---|---|---|---|---|---|
| Sample A-4 | AVG. | 0.295 | 0.480 | 61.02 | 37.35 | 13.18 | 11.44 | -9.10 | -17.39 | 44.93 |
| | STDEV. | 0.008 | 0.005 | 1.20 | 0.641 | 0.070 | 4.587 | 0.464 | 0.298 | 1.091 |
| CoCrPtTaNb 74/17/5/2/2 (NiAl 500Å/CrV100Å) | AVG. | 0.280 | 0.481 | 57.80 | 36.81 | 13.53 | 11.00 | -10.75 | -17.32 | 47.77 |
| | STDEV. | 0.009 | 0.004 | 1.27 | 0.352 | 0.111 | 0.826 | 0.690 | 0.272 | 0.463 |
| CoCrPtTaNb 74/17/5/2/2 (No NiAl / CrV300Å) | AVG. | 0.316 | 0.494 | 63.51 | 36.35 | 12.99 | 12.77 | -12.48 | -16.51 | 43.60 |
| | STDEV. | 0.004 | 0.005 | 0.51 | 0.243 | 0.072 | 0.663 | 2.166 | 0.087 | 0.517 |
| CoCrPtTaNb 74/17/5/2/2 (No NiAl / CrV500Å) | AVG. | 0.308 | 0.481 | 63.60 | 34.94 | 12.87 | 9.56 | -10.20 | -17.04 | 45.99 |
| | STDEV. | 0.008 | 0.006 | 0.93 | 0.514 | 0.023 | 1.708 | 0.962 | 0.374 | 0.431 |

Table. 4

MAGNETIC RECORDING MEDIA USED IN A HIGH-DENSITY HARD DISK DRIVE

BACKGROUND OF THE INVENTION

1. Field of the Invention

The invention relates to a magnetic recording medium, and more particularly, to a magnetic recording medium used in a high-density hard disk drive.

2. Description of the Prior Art

High-density hard disk drives comprising a plurality of magnetic recording media are currently widely used in computer systems for recording large amounts of data. In recent years, considerable effort has been made in achieving higher storage density and coercivity through the development of magnetic recording media using magnetic thin films. Key terms for factors affecting the storage density of magnetic recording media are defined as follows:

(a) Coercivity (Hc): the magnetic field required to reduce remanence magnetic flux to zero. A higher coercivity is associated with a higher information storage density by allowing adjacent recording bits to be placed more closely without mutual cancellation. Most material used in the industry today have an Hc greater than 2200 Oersteds (Oe).

(b) Orientation Ratio: the ratio of the coercivity of the magnetic track in the circumferential direction to that in the radial direction. An orientation ratio close to 1 indicates that the magnetic recording has a very stable signal output as its magnetic properties are less affected by the surface texture of the magnetic recording medium.

(c) Signal-to-Noise Ratio (SNR): defined as $20*\log$[Signal Voltage/Noise Voltage]. A high SNR is associated with a high bit density to be read with a given degree of reliability since more signals can be detected in a low noise reading operation setting.

(d) Off Track Capability (OTC): defined as the capability of a read/write head to be shifted away from a track while information imprinted on the track is still being read.

(e) Overwrite capability (Ow): defined as $20*\log$[Residual LFTAA/Original LFTAA]. Overwrite capability is the effectiveness of erasing a signal read at one frequency by a higher frequency signal and provides a measure of a remaining residual signal after the old signal is overwritten by a new signal. The more negative the value of Ow the better the overwrite capability. Generally, the value is required to be less than −26 dB.

(f) Positive, Negative Modulation (PMOD, NMOD): PMOD is defined as the continuous signal present in a track above a designated percentage whereas NMOD is defined as the continuous signal present in a track below a designated percentage.

Currently, magnetic thin films in magnetic recording media of hard disk drives often use CoCrPtTa alloy/Cr, CoCrPtTa alloy/CrV alloy, or CoCrPt alloy/NiAl alloy as their magnetic layer/sublayer structures. The CoCrPtTa/Cr and CoCrPtTa/CrV alloy magnetic thin films and their off track capability (OTC) need improvement as do their orientation ratios which, at 1.2, is far removed from the most optimal value of 1. The CoCrPtTa/CrV magnetic thin film and the CoCrPt alloy/NiAl alloy magnetic thin film can generate high coercivity, however, both come with a price. To achieve high coercivity, the CoCrPtTa/CrV magnetic thin film generates high levels of noise and the CoCrPt alloy/NiAl alloy magnetic thin film requires the thickness of its magnetic layer to be over 1000 Å while the NiAl alloy base layer must be between 400 Å~500. Such rigid requirements in the specific thickness of the various parts may cause implementation problems when used in some industrial applications.

SUMMARY OF THE INVENTION

It is an objective of the present invention to provide a magnetic recording medium which has high SNR, high coercivity, high off track capability, good overwrite capability, and good orientation ratio so as to increase the storage density and read/write capacity of the magnetic recording medium.

Briefly, in a preferred embodiment, the present invention provides a magnetic recording medium used in a hard disk drive comprising:

a nonmagnetic substrate;

a sublayer comprising CrV alloy sputtered onto the nonmagnetic substrate, the CrV alloy layer comprising 75~85 atomic percent chromium and 15~25 atomic percent vanadium;

a magnetic layer comprising CoCrPtTaNb alloy sputtered onto the sublayer, the magnetic layer comprising 70~85 atomic percent cobalt, 10~30 atomic percent chromium, 2~15 atomic percent platinum, 2~10 atomic percent tantalum, 1~6 atomic percent niobium; and a carbon overcoat sputtered onto the magnetic layer.

Wherein the magnetic recording medium may further comprise a NiAl alloy seed layer sputtered between the substrate and the CrV alloy sublayer such as that used in general magnetic recording media, the seed layer comprising 40~60 atomic percent nickel and 60~40 atomic percent aluminum.

It is an advantage of the present invention that the magnetic recording medium has high coercivity, high SNR, high off track capability, good overwrite capability, and good orientation ratio thereby improving the storage density and read/write capacity of the magnetic recording medium.

These and other objects and the advantages of the present invention will no doubt become obvious to those of ordinary skill in the art after having read the following detailed description of the preferred embodiment that is illustrated in the various figures and drawings.

BRIEF DESCRIPTION OF THE DRAWINGS

Tables. 1, 2, 3 and 4 compare magnetic recording medium factors of the present invention to those of other prior art magnetic recording media.

DETAILED DESCRIPTION OF THE PREFERRED EMBODIMENT

Figure 1:
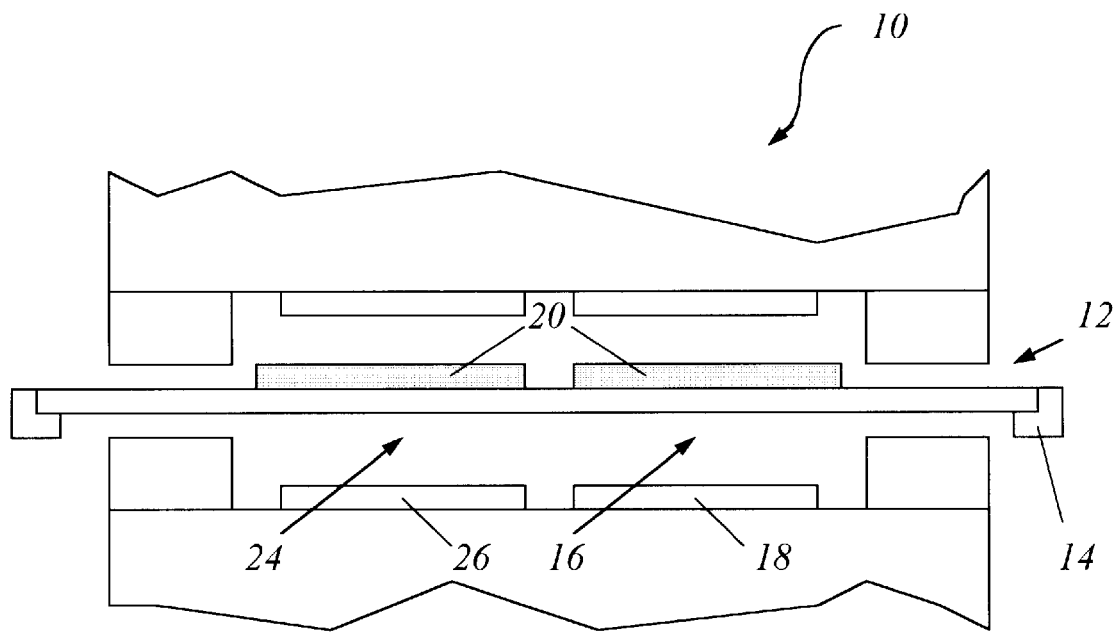
FIG. 1 is a sectional view of a prior art sputtering apparatus for manufacturing the prior art magnetic recording medium.

Please refer to FIG. 1. FIG. 1 is a sectional view of a prior art sputtering apparatus 10 for manufacturing a magnetic recording medium 30. The sputtering apparatus 10 comprises a vacuum chamber 12 which has several stations at which sputtering or heating operations take place. A heating station (not shown) is located at the upstream end of the vacuum chamber 12. The heating station has a plurality of infrared lights for heating both sides of the substrate 20 to a temperature of 80° C. to 250° C. as a disk holder 14 carries the substrate 20 through the heating station in the vacuum chamber 12. The sputtering apparatus 10 further comprises a first sputtering station 16 wherein a base layer such as an electrolessly plated surface layer is plated onto the substrate 20 by sputtering a pair of targets 18, and a second sputtering station 24 at the downstream end of the vacuum chamber 12 wherein a magnetic thin-film layer is plated onto the base layer by sputtering another pair of targets 26. In a sputtering operation, the vacuum chamber 12 is evacuated to a near-vacuum level pressure of approximately $10^{-7}$ torr, then argon gas is introduced into the vacuum chamber 12 to a pressure of 2~10 mTorr.

Figure 2:
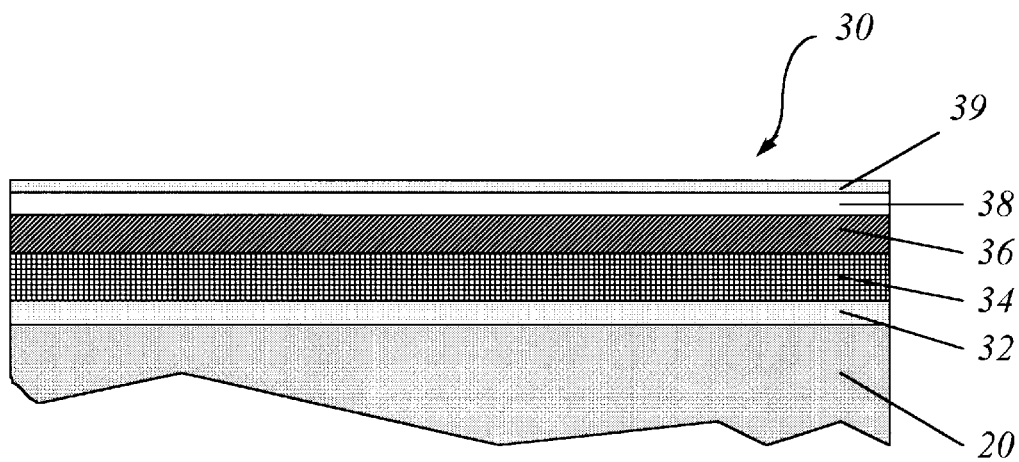
FIG. 2 is a sectional view of a magnetic recording medium according to the present invention.

Please refer to FIG. 2. FIG. 2 is a sectional view of a magnetic recording medium 30 according to the present invention. The magnetic recording medium 30 comprises a nonmagnetic substrate 20, an electrolessly plated surface layer built on the substrate 20 for both strengthening the layer and smoothing the surface of substrate 20, a seed layer 32 and a sublayer 34 sputtered onto the surface layer, a magnetic layer 36 sputtered onto the sublayer 34, a carbon overcoat 38 sputtered onto the magnetic layer 36, and a lubricant layer 39 coating on the carbon overcoat 38.

The magnetic recording medium 30 comprises a rigid substrate 20. The substrate 20 is commonly made of AlMg alloy, its surface being electrolessly plated with an NiP surface layer which must have a smooth, polished, ground micro-textured surface. For reduced friction between the magnetic head and the magnetic recording medium 30 and increased durability of the magnetic head and the magnetic recording medium 30, the roughness (Ra) of the NiP surface layer must be plated to within 2~15 Å in thickness. The AlMg alloy may be substituted by glass, ceramic or glass-ceramic.

In order to firmly bind a metallic layer of the magnetic recording medium 30 to the NiP surface layer of the substrate 20, a seed layer 32 made of NiAl alloy comprising 40–60 atomic percent nickel, and 60~40 atomic percent aluminum and measuring approximately 200–1000 Å in thickness is sputtered onto the surface layer of the substrate 20. The deposition rate of the sputtering process is 35~45 Å/sec.kWatts, and the sputtering voltage is maintained between 550~650 Volts. The seed layer 32 is sputtered onto the NiP surface layer to form a layer of fine grains which measure approximately 100 ~300 Å so that the CoCrPtTaNb alloy magnetic layer 36 can be subsequently sputtered atop the fine grains of the NiAl alloy.

The magnetic recording medium 30 further comprises a sublayer 34 made of CrV alloy and comprising 75~85 atomic percent chromium and 15~25 atomic percent vanadium sputtered onto the seed layer 32 to a preferred sputtering thickness of 50 Å to 1000 Å, a sputtering voltage of 350 ~450 Volts, and a deposit rate of 45~55 Å/sec.kWatts. There is a good lattice match between the CrV alloy and the CoCrPtTaNb alloy to be sputtered and the magnetic layer 36 as they have similar lattice constants. Such a lattice match will in turn improve the coercivity (Hc) of the magnetic recording medium 30.

As mentioned above, the magnetic layer 36 sputtered onto the sublayer 34 is made of CoCrPtTaNb alloy which comprises 70~85 atomic percent cobalt, 10~30 atomic percent chromium, 2~15 atomic percent tantalum, 2~10 atomic percent platinum, and 1~6 atomic percent niobium. The magnetic layer 36 is preferentially sputtered to a thickness of between 100 Å and 400 Å at a sputtering voltage of approximately 300~450 Volts, and at a deposit rate of 45~55 Å/sec.kWatts.

After the magnetic layer 36 is sputtered onto the sublayer 34, the temperature of the magnetic recording medium 30 is rapidly cooled down to 40° C.~80° C. Gas comprising hydrogen, nitrogen and argon is used for sputtering a carbon overcoat 38 over the magnetic layer 36 in a low pressure environment of 5~10 mTorr. The carbon overcoat 38 is preferably sputtered to a thickness between 60 Å to 140 Å at a sputtering voltage around 500~700 Volts, and at a depositing rate of 8~15 Å/sec.kWatts and is used for protecting the magnetic layer 36 and magnetic heads. Finally, a lubricant layer 39 is coated over the carbon overcoat 38 to prevent abrasion, thus completing the manufacturing process for the high-density magnetic recording medium. A coercivity (Hc) of greater than 4000 Oersteds can be achieved by the present invention.

In general, in the process of manufacturing a magnetic recording medium, the fine grain structure of the seed layer 32 is essential as it can reduce noise generated by the magnetic recording medium 30 by reducing interaction between the grains. However, even if the CoCrPtTaNb alloy of the present invention is sputtered to form the magnetic layer 36 in a glass or AlMg alloy substrate 20 without the NiAl seed layer 32 and is simply covered directly with a CrV sublayer 34 measuring between 200~1000 Å in thickness, the coercivity of the magnetic recording medium 30 can still be enhanced to over 3700 Oersteds.

Please refer to Tables 1 to 4. Tables 1 to 4 compare certain magnetic recording media factors of the present invention with two prior art magnetic recording media. A and B represent commercial magnetic recording media comprising a non-magnetic AlMg substrate, a NiAl seed layer, a CrV sublayer and a CoCrPtTaNb magnetic layer. The magnetic recording media of the present invention similarly comprises a substrate, sublayer and magnetic layer wherein the magnetic layer comprises relative percentage compositions of CoCrPtTaNb alloy in two forms: 76/15/5/2/2 and 74/17/5/2/2. All samples are tested using the Guzik test where the inside diameter and outer diameter are subdivided into two parts. As can be seen in the tables, the magnetic parameters of the magnetic recording media in the present invention approximate those of samples A and B and even surpass samples A and B in certain parameters such as squeeze (SQZ), SNR, Noise, Resolution (Res), to name a few. On the whole, the performance of set CoCrPtTaNb (74/17/5/2/2) is as good as that of set CoCrPtTaNb (76/15/5/2/2).

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A magnetic recording medium used in a hard disk drive comprising:

a nonmagnetic substrate;

a sublayer comprising CrV alloy sputtered on the nonmagnetic substrate, the CrV alloy layer comprising 75~85 atomic percent chromium and 15~25 atomic percent vanadium;

a magnetic layer comprising CoCrPtTaNb alloy sputtered onto the sublayer, the magnetic layer comprising 70~85 atomic percent cobalt, 10~30 atomic percent chromium, 2~15 atomic percent platinum and 2~10 atomic percent tantalum, 1~6 atomic percent niobium; and a carbon overcoat sputtered on the magnetic layer.

2. The magnetic recording medium of claim 1 wherein the nonmagnetic substrate is made of glass.

3. The magnetic recording medium of claim 1 wherein the nonmagnetic substrate is made of ceramic.

4. The magnetic recording medium of claim 1 wherein the nonmagnetic substrate is made of glass-ceramic.

5. The magnetic recording medium of claim 1 wherein the nonmagnetic substrate is made of aluminum.

6. The magnetic recording medium of claim 5 wherein the nonmagnetic substrate further comprises an NiP layer plated electrolessly onto its surface.

7. The magnetic recording medium of claim 1 further comprising a seed layer comprising NiAl alloy of 40~60 atomic percent nickel and 60~40 atomic percent aluminum sputtered between the nonmagnetic substrate and the CrV alloy sublayer.

8. The magnetic recording medium of claim 7 wherein the thickness of the seed layer is around 200 Å~1000 Å.

9. The magnetic recording medium of claim 7 wherein the thickness of the CrV alloy layer is around 50 Å~1000 Å.

10. The magnetic recording medium of claim 9 wherein the coercivity (Hc) of the magnetic recording medium is greater than 4000 Oersteds.

11. The magnetic recording medium of claim 1 wherein the thickness of the magnetic layer is around 100 Å~400 Å.

12. The magnetic recording medium of claim 1 wherein the thickness of the CrV alloy layer is around 200 Å~1000 Å.

13. The magnetic recording medium of claim 10 wherein the coercivity (Hc) of the magnetic recording medium is greater than 3700 Oersteds.

* * * * *